United States Patent
Kwon et al.

(10) Patent No.: US 11,092,891 B2
(45) Date of Patent: Aug. 17, 2021

(54) PHOTOSENSITIVE RESIN COMPOSITION AND COLOR FILTER USING THE SAME

(71) Applicant: Samsung SDI Co., Ltd., Yongin-si (KR)

(72) Inventors: Jiyun Kwon, Suwon-si (KR); Obum Kwon, Suwon-si (KR); Jonggi Kim, Suwon-si (KR); Hojeong Paek, Suwon-si (KR); Jinseong Park, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 269 days.

(21) Appl. No.: 15/766,146

(22) PCT Filed: Oct. 12, 2016

(86) PCT No.: PCT/KR2016/011430
§ 371 (c)(1),
(2) Date: Apr. 5, 2018

(87) PCT Pub. No.: WO2017/146336
PCT Pub. Date: Aug. 31, 2017

(65) Prior Publication Data
US 2018/0299775 A1   Oct. 18, 2018

(30) Foreign Application Priority Data
Feb. 26, 2016   (KR) .................. 10-2016-0023640

(51) Int. Cl.
| G03F 7/031 | (2006.01) |
| G03F 7/004 | (2006.01) |
| G03F 7/027 | (2006.01) |
| G03F 7/033 | (2006.01) |
| G03F 7/00 | (2006.01) |
| G03F 7/20 | (2006.01) |
| G02B 5/22 | (2006.01) |

(52) U.S. Cl.
CPC ............. *G03F 7/031* (2013.01); *G02B 5/223* (2013.01); *G03F 7/0007* (2013.01); *G03F 7/0048* (2013.01); *G03F 7/027* (2013.01); *G03F 7/0275* (2013.01); *G03F 7/033* (2013.01); *G03F 7/2053* (2013.01)

(58) Field of Classification Search
CPC ........ G03F 7/0231; G03F 7/033; G03F 7/031; G03F 7/027; G03F 7/0007
See application file for complete search history.

(56) References Cited

U.S. PATENT DOCUMENTS

| 3,364,182 | A | * | 1/1968 | Griffith | .................... | C08F 2/38 |
| | | | | | | 526/211 |
| 8,748,070 | B2 | | 6/2014 | Nukada et al. | | |
| 10,268,066 | B2 | * | 4/2019 | Lee | .................... | G02B 5/201 |
| 2006/0154180 | A1 | * | 7/2006 | Kannurpatti | .............. | G03F 7/105 |
| | | | | | | 430/311 |
| 2011/0217636 | A1 | * | 9/2011 | Kanna | ................... | C09B 57/00 |
| | | | | | | 430/7 |
| 2012/0257283 | A1 | | 10/2012 | Maruyama et al. | | |
| 2014/0158954 | A1 | | 6/2014 | Lun et al. | | |
| 2014/0212812 | A1 | * | 7/2014 | Kim | ................... | C08F 14/18 |
| | | | | | | 430/285.1 |
| 2015/0301408 | A1 | | 10/2015 | Li | | |
| 2015/0330602 | A1 | * | 11/2015 | Yonemoto | ............ | C09K 11/703 |
| | | | | | | 349/71 |
| 2016/0011506 | A1 | | 1/2016 | Gu et al. | | |

FOREIGN PATENT DOCUMENTS

| CN | 102834472 A | 12/2012 |
| CN | 103353629 A | 10/2013 |
| CN | 103728837 A | 4/2014 |
| CN | 104335119 A | 2/2015 |
| CN | 104641266 A | 5/2015 |
| CN | 105259694 A | 1/2016 |
| EP | 2157479 A1 | 2/2010 |
| JP | 2009-509129 A | 3/2009 |
| JP | 2009-545883 A | 12/2009 |
| JP | WO2009/096432 A1 | 5/2011 |
| KR | 10-2005-0055741 A | 6/2005 |
| KR | 10-0507844 | 8/2005 |
| KR | 10-2010-0052948 A | 5/2010 |
| KR | 10-2010-0053409 A | 5/2010 |
| KR | 10-1142847 B1 | 5/2012 |
| KR | 10-2015-0000427 | 1/2015 |
| KR | 10-2015-0075039 A | 7/2015 |
| TW | 201125880 A | 8/2011 |
| WO | WO 2014/181245 A1 | 11/2014 |

OTHER PUBLICATIONS

Jang, et al., Solution processable and photopatternable blue, green and red quantum dots suitable for full color displays devices; Optical Materials Express, 2012, vol. 2, No. 5, pp. 519-525.
Chinese Office action dated Aug. 5, 2020.

* cited by examiner

*Primary Examiner* — John S Chu
(74) *Attorney, Agent, or Firm* — Lee IP Law, PC

(57) ABSTRACT

A photosensitive resin composition includes (A) a photoconversion material; (B) a binder resin; (C) a photopolymerizable monomer; (D) a photopolymerization initiator; and (E) a solvent, wherein the solvent includes a first solvent having a polarity index (Snyder Polarity Index) of 0.1 times or less relative to a polarity index of water. The photosensitive resin composition having excellent color reproducibility, color purity, viewing angle, and the like may be provided by using a photoconversion material instead of a pigment or a dye conventionally used as a color material and a color filter having an excellent photo-conversion ratio by using this photosensitive resin composition may be provided.

11 Claims, 9 Drawing Sheets

PHOTOSENSITIVE RESIN COMPOSITION AND COLOR FILTER USING THE SAME

CROSS REFERENCE TO RELATED APPLICATIONS

This is the U.S. national phase application based on PCT Application No. PCT/KR2016/011430, filed Oct. 12, 2016, which is based on Korean Patent Application No. 10-2016-0023640, filed Feb. 26, 2016, the entire contents of all of which are hereby incorporated by reference.

BACKGROUND OF THE INVENTION

(a) Field of the Invention

This disclosure relates to a photosensitive resin composition and a color filter manufactured using the same.

(b) Description of the Related Art

In general, a color filter applied to a display is formed by using a photosensitive resist composition, forming a desired pattern through an exposure process by using a photomask, and then, dissolving and removing a non-exposed region through a development process. A material for the color filter may be required of alkali-solubility, high sensitivity, adherence to a substrate, chemical resistance, heat resistance, and the like. As for a color material, a pigment or a dye is generally used.

However, the pigment has excellent thermal or chemical resistance but is not well dispersed in a solvent and thus has no excellent color characteristics such as luminance, and the dye has excellent color characteristics but deteriorated durability, and thus no excellent thermal or chemical resistance.

Accordingly, a novel photoluminescent-type photosensitive resin composition capable of overcoming a technological limit of a currently-used photosensitive resin composition using the pigment or the dye as a color material and a color filter material applying this novel photoluminescent-type photosensitive resin composition are being continuously developed.

SUMMARY OF THE INVENTION

An embodiment provides a photosensitive resin composition having improved color reproducibility, color purity, viewing angles, and the like without using a pigment and a dye.

Another embodiment provides a color filter having an improved photo-conversion ratio manufactured using the photosensitive resin composition.

An embodiment provides a photosensitive resin composition including (A) a photo-conversion material; (B) a binder resin; (C) a photopolymerizable monomer; (D) a photopolymerization initiator; and (E) a solvent, wherein the solvent includes a first solvent having a polarity index (Snyder Polarity Index) of 0.1 times or less relative to a polarity index of water.

The photosensitive resin composition may further include a second solvent having a polarity index (Snyder Polarity Index) of 0.2 times to 0.6 times relative to a polarity index of water.

The first solvent may be included in an amount of 0.3 times or greater relative to the amount of the second solvent.

The photosensitive resin composition may further include (F) a thiol-based additive.

The thiol-based additive may include at least two functional groups represented by Chemical Formula 1.

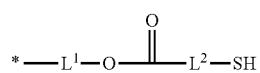

[Chemical Formula 1]

In Chemical Formula 1,
$L^1$ and $L^2$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

The thiol-based additive may be included in an amount of 1 wt % to 10 wt % based on the total amount of the photosensitive resin composition.

The photosensitive resin composition may further include (G) a scatter.

The scatter may include barium sulfate, calcium carbonate, titanium dioxide, zirconia, or a combination thereof.

The scatter may be included in an amount of 0.1 wt % to 5 wt % based on the total amount of the photosensitive resin composition.

The photo-conversion material may be a quantum dot that absorbs light in a wavelength region of 360 nm to 780 nm and emits fluorescence in a wavelength region of 500 nm to 700 nm.

The photosensitive resin composition may include 1 wt % to 50 wt % of the (A) photo-conversion material; 10 wt % to 50 wt % of (B) the binder resin; 1 wt % to 30 wt % of (C) the photopolymerizable monomer; 0.1 wt % to 5 wt % of (D) the photopolymerization initiator; and a balance amount of (E) the solvent based on the total amount of the photosensitive resin composition.

The photosensitive resin composition may further include malonic acid, 3-amino-1,2-propanediol, a silane-based coupling agent, a leveling agent, a fluorine-based surfactant, or a combination thereof.

Another embodiment provides a color filter manufactured using the photosensitive resin composition.

Other embodiments of the present invention are included in the following detailed description.

A photosensitive resin composition having excellent color reproducibility, color purity, viewing angle, and the like may be provided by using a photoconversion material instead of a pigment or a dye conventionally used as a color material and a color filter having an excellent photo-conversion ratio by using this photosensitive resin composition may be provided.

DETAILED DESCRIPTION

Figure 1:
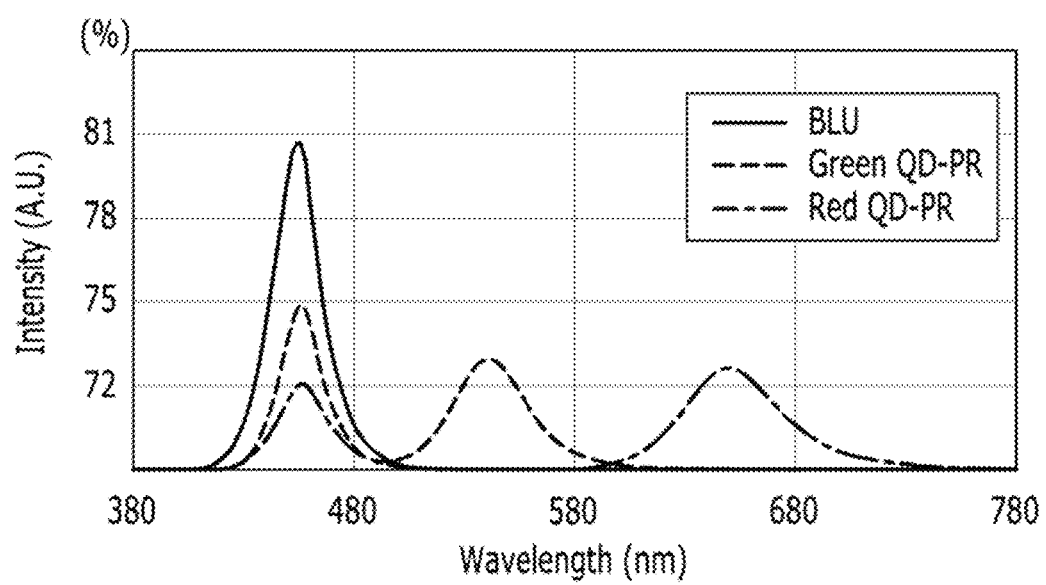
FIG. 1 shows spectra of each photosensitive resin composition respectively including a green quantum dot and a red quantum dot about a Blue LED backlight (BLU).

Hereinafter, embodiments of the present invention are described in detail. However, these embodiments are exemplary, the present invention is not limited thereto and the present invention is defined by the scope of claims.

In the present specification, when specific definition is not otherwise provided, "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

In the present specification, when specific definition is not otherwise provided, the term "substituted" may refer to substitution with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

In the present specification, when specific definition is not otherwise provided, the term "hetero" may refer to one substituted with at least one hetero atom of N, O, S and P, in a chemical formula.

In the present specification, when specific definition is not otherwise provided, "(meth)acrylate" refers to both "acrylate" and "methacrylate", and "(meth)acrylic acid" refers to "acrylic acid" and "methacrylic acid".

In the present specification, when specific definition is not otherwise provided, the term "combination" refers to mixing or copolymerization.

In the present specification, unless a specific definition is otherwise provided, a hydrogen atom is boned at the position when a chemical bond is not drawn where supposed to be given.

In the present specification, a cardo-based resin refers to a resin including at least one functional group selected from Chemical Formula 3-1 to Chemical Formula 3-11 in its backbone.

In the present specification, when specific definition is not otherwise provided, a polarity index refers to a Snyder polarity index.

In the present specification, when specific definition is not otherwise provided, "*" indicates a point where the same or different atom or chemical formula is linked.

A photosensitive resin composition according to an embodiment includes (A) a photo-conversion material; (B) a binder resin; (C) a photopolymerizable monomer; (D) a photopolymerization initiator; and (E) a solvent, wherein the solvent includes a first solvent having a polarity index (Snyder Polarity Index) of 0.1 times or less relative to a polarity index of water.

Hereinafter, each component is described in detail.

(A) Photo-Conversion Material

The photo-conversion material may absorb light in a wavelength region of 360 nm to 780 nm, for example 400 nm to 780 nm and emit fluorescence in a wavelength region of 500 nm to 700 nm, for example, 500 nm to 580 nm, or 600 nm to 680 nm. That is, the photo-conversion material may have a maximum fluorescence wavelength (fluorescence $\lambda_{em}$) in a wavelength of 500 nm to 680 nm.

For example, the photo-conversion material may be a quantum dot.

The quantum dot may have a full width at half maximum (FWHM) in a range of 20 nm to 100 nm, for example, 20 nm to 50 nm. When the quantum dot has a full width at half maximum (FWHM) within the range, the quantum dot has high color purity and thus an effect on increasing color reproducibility when used as a color material in a color filter.

The quantum dot may be an organic material, an inorganic material, or a hybrid (mixture) of the organic material and the inorganic material.

The quantum dot may comprises a core and a shell surrounding the core, and herein, the core and the shell may have a structure such as a core independently comprising II-IV groups, III-V groups, and the like, a core/a shell, a core/a first shell/a second shell, an alloy, an alloy/a shell, and the like but are not limited thereto.

For example, the core may include at least one material selected from CdS, CdSe, CdTe, ZnS, ZnSe, ZnTe, HgS, HgSe, HgTe, GaN, GaP, GaAs, InP, InAs, and an alloy thereof but is not necessarily limited thereto. The shell surrounding the core may include at least one material selected from CdSe, ZnSe, ZnS, ZnTe, CdTe, PbS, TiO, SrSe, HgSe, and an alloy thereof but is not necessarily limited thereto.

In an embodiment, since an interest in an environment has been recently much increased over the whole world, and a regulation about a toxic material also has been fortified, a non-cadmium-based light emitting material having little low quantum efficiency (quantum yield) but being environmentally-friendly instead of a light emitting material having a cadmium-based core is used but not necessarily limited thereto.

The quantum dot having a core/shell structure may have an entire size including the shell (an average particle diameter) of 1 nm to 15 nm, for example, 5 nm to 15 nm but its structure is not particularly limited.

For example, the quantum dot may be a red quantum dot, a green quantum dot, or a combination thereof. The red quantum dot may have an average particle diameter of 10 nm to 15 nm. The green quantum dot may have an average particle diameter of 5 nm to 8 nm.

On the other hand, the photosensitive resin composition according to an embodiment may further include a dispersing agent for dispersion stability of the quantum dot. The dispersing agent may help a photo-conversion material such as the quantum dot uniformly dispersed in the photosensitive resin composition and include a non-ionic, anionic, or cationic dispersing agent. Specifically, the dispersing agent may include polyalkylene glycol or esters thereof, polyoxy alkylene, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines. They may be used alone or as a mixture of two or more. The dispersing agent may be used in an amount of 0.1 wt % to 100 wt %, for example, 10 wt % to 20 wt % based on the solid of the photo-conversion material.

The photo-conversion material may be included in an amount of 1 wt % to 50 wt %, for example, 10 wt % to 30 wt % based on the total amount of the photosensitive resin composition according to an embodiment. When the photo-conversion material is included within the range, an excellent photoconversion rate may be obtained, and in addition, excellent processability may be obtained, since pattern characteristics and development characteristics are not deteriorated.

(B) Binder Resin

The binder resin may include an acryl-based binder resin, a cardo-based binder resin, or a combination thereof.

acrylate/styrene/2-hydroxyethylmethacrylate copolymer, and the like, but are not limited thereto. These may be used alone or as a mixture of two or more.

The acryl-based binder resin may have a weight average molecular weight of 3,000 g/mol to 100,000 g/mol, for example 5,000 g/mol to 50,000 g/mol, for example 15,000 g/mol to 30,000 g/mol. When the acryl-based binder resin has a weight average molecular weight within the range, close-contacting properties to a substrate, and physical and chemical properties are improved and viscosity is appropriate.

The acryl-based binder resin may have an acid value of 15 mgKOH/g to 100 mgKOH/g, for example 30 mgKOH/g to 50 mgKOH/g. When the acryl-based binder resin has an acid value within the range, a pixel has excellent resolution.

The cardo-based binder resin may include a repeating unit represented by Chemical Formula 3.

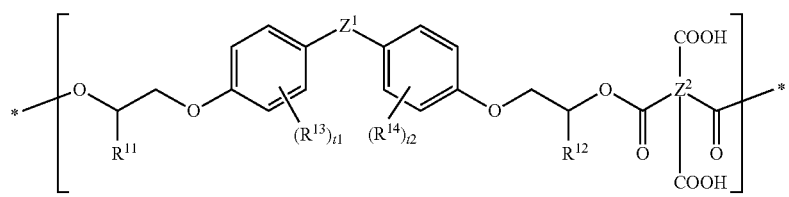

[Chemical Formula 3]

The acryl-based binder resin is a copolymer of a first ethylenic unsaturated monomer and a second ethylenic unsaturated monomer that is copolymerizable therewith, and is a resin including at least one acryl-based repeating unit.

The first ethylenic unsaturated monomer is an ethylenic unsaturated monomer including at least one carboxyl group. Examples of the monomer include acrylic acid, methacrylic acid, maleic acid, itaconic acid, fumaric acid, or a combination thereof.

The first ethylenic unsaturated monomer may be included in an amount of 5 wt % to 50 wt %, for example, 10 wt % to 40 wt % based on the total amount of the acryl-based binder resin.

The second ethylenic unsaturated monomer may be an aromatic vinyl compound such as styrene, α-methylstyrene, vinyl toluene, vinylbenzylmethylether, and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated carboxylic acid amino alkyl ester compound such as 2-aminoethyl (meth)acrylate, 2-dimethylaminoethyl(meth)acrylate, and the like; a carboxylic acid vinyl ester compound such as vinyl acetate, vinyl benzoate, and the like; a unsaturated carboxylic acid glycidyl ester compound such as glycidyl (meth)acrylate, and the like; a vinyl cyanide compound such as (meth)acrylonitrile, and the like; a unsaturated amide compound such as (meth)acrylamide, and the like; and the like. These may be used alone or as a mixture of two or more.

Specific examples of the acryl-based binder resin may be a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmeth- In Chemical Formula 3, $R^{11}$ and $R^{12}$ are independently a hydrogen atom or a substituted or unsubstituted (meth)acryloyloxy alkyl group, $R^{13}$ and $R^{14}$ are independently hydrogen atom, a halogen atom, or a substituted or unsubstituted C1 to C20 alkyl group, and $Z^1$ is a single bond, O, CO, $SO_2$, $CR^{17}R^{18}$, $SiR^{19}R^{20}$ (wherein, $R^{17}$ to $R^{20}$ are independently a hydrogen atom or a substituted or unsubstituted C1 to C20 alkyl group), or one of linking groups represented by Chemical Formula 3-1 to Chemical Formula 3-11,

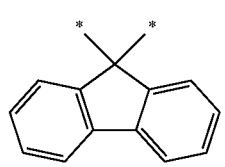

[Chemical Formula 3-1]

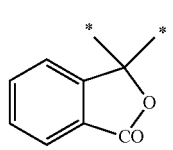

[Chemical Formula 3-2]

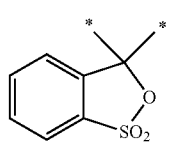

[Chemical Formula 3-3]

-continued

[Chemical Formula 3-4]
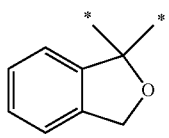

[Chemical Formula 3-5]
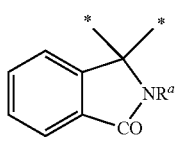

In Chemical Formula 3-5,
$R^a$ is a hydrogen atom, an ethyl group, $C_2H_4Cl$, $C_2H_4OH$, $CH_2CH=CH_2$, or a phenyl group.

[Chemical Formula 3-6]
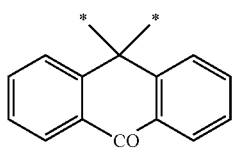

[Chemical Formula 3-7]
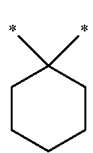

[Chemical Formula 3-8]
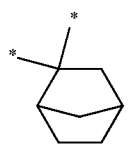

[Chemical Formula 3-9]
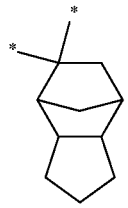

[Chemical Formula 3-10]
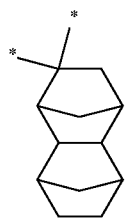

[Chemical Formula 3-11]
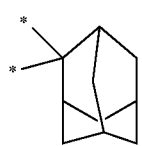

$Z^2$ is an acid anhydride residual group, and
t1 and t2 are independently integers ranging from 0 to 4.
The cardo-based binder resin may have a weight average molecular weight of 500 g/mol to 50,000 g/mol, for example 1,000 g/mol to 30,000 g/mol. When the cardo-based binder resin a weight average molecular weight within the range, a pattern may be well formed without a residue during manufacture of a photosensitive organic film and without loss of a film thickness during development.

The cardo-based binder resin may include a functional group represented by Chemical Formula 42 at least one terminal end.

[Chemical Formula 4]
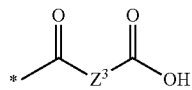

In Chemical Formula 4,
$Z^3$ is represented by Chemical Formulae 4-1 to 4-7.

[Chemical Formula 4-1]
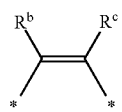

In Chemical Formula 4-1, $R^b$ and $R^c$ are independently hydrogen, a substituted or unsubstituted C1 to C20 alkyl group, an ester group, or an ether group.

[Chemical Formula 4-2]

[Chemical Formula 4-3]
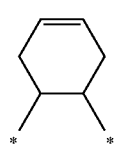

[Chemical Formula 4-4]

[Chemical Formula 4-5]

In Chemical Formula 4-5, $R^d$ is O, S, NH, a substituted or unsubstituted C1 to C20 alkylene group, a C1 to C20 alkylamine group, or a C2 to C20 alkenylamine group.

[Chemical Formula 4-6]

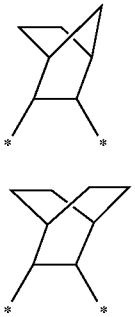

[Chemical Formula 4-7]

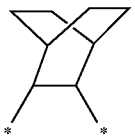

The cardo-based resin may be, for example prepared by mixing at least two of, a fluorene-containing compound such as 9,9-bis(4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent-based compound such propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like.

When the binder resin is a cardo-based binder resin, a first organic layer composition including the cardo-based binder resin has excellent developability and sensitivity during photo-curing and thus, fine pattern-forming capability.

The binder resin may be included in an amount of 1 wt % to 20 wt %, for example 3 wt % to 15 wt % based on the total amount of the photosensitive resin composition. When the binder resin is included within the range, excellent sensitivity, developability, resolution and linearity of a pattern may be obtained.

(C) Photopolymerizable Monomer

The photopolymerizable monomer may include a multi-functional monomer having two or more hydroxyl groups.

The photopolymerizable monomer having two or more hydroxyl groups may cause sufficient polymerization during exposure in a pattern-forming process and form a pattern having excellent heat resistance, light resistance, and chemical resistance.

Specific examples of the photopolymerizable monomer may be glycerolacrylate, dipentaerythritolhexaacrylate, ethylene glycoldiacrylate, triethylene glycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenolAdiacrylate, trimethylol propanetriacrylate, novolacepoxyacrylate, ethylene glycoldimethacrylate, diethylene glycoldimethacrylate, triethylene glycoldimethacrylate, propylene glycoldimethacrylate, 1,4-butanedioldimethacrylate, 1,6-hexanedioldimethacrylate, and the like, but are not limited thereto.

Commercially available examples of the photopolymerizable monomer are for example Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like; Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like; Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. These may be used alone or as a mixture of two or more, but is not limited thereto.

The photopolymerizable monomer may be treated with acid anhydride to improve developability.

The photopolymerizable monomer may be included in an amount of 0.1 wt % to 30 wt %, for example 1 wt % to 10 wt % based on the total amount of the photosensitive resin composition. When the photopolymerizable monomer is included within the range, excellent pattern-forming capability and excellent durability (heat resistance, light resistance and chemical resistance, etc.) may be obtained. Preferably, three or more multi-functional monomers may be effectively applied.

(D) Photopolymerization Initiator

The photopolymerization initiator may be a generally-used initiator for a photosensitive resin composition, and may be, for example an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphthol-yl)-4,6-bis (trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholine-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

The photopolymerization initiator may further include a carbazole-based compound, a diketone-based compound, a sulfonium borate-based compound, a diazo-based compound, an imidazole-based compound, a biimidazole-based compound, and the like besides the compound.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.1 wt % to 5 wt %, for example 0.2 wt % to 1 wt % based on the total amount of photosensitive resin composition. When the photopolymerization initiator is included within the range, a balance between sensitivity and developability during exposure is improved and a pattern having improved resolution without a residual film may be obtained.

(E) Solvent

A photosensitive resin composition according to an embodiment includes a photo-conversion material such as a quantum dot and the like instead of a pigment or a dye as a color material and thus should necessarily include a solvent having compatibility with the photo-conversion material. That is, the solvent may include a first solvent having a polarity index (Snyder Polarity Index) of 0.1 times or less relative to a polarity index of water.

For example, the first solvent may have a dielectric constant of less than or equal to 8 when the dielectric constant of water is 80.

However, the water has a polarity index of 9 and thus may not disperse the photo-conversion material such as the quantum dot and the like. The photo-conversion material such as the quantum dot and the like has a hydrophobic surface and thus may be agglomerated in the solvent such as water. Accordingly, a solvent having a low polarity index and thus compatibility with the photo-conversion material is needed. In particular, a solvent having the polarity index of 0.1 times or less (a polarity index of 0.9 or less) relative to a polarity index of water has excellent compatibility with the photo-conversion material and thus may significantly improve a photo-conversion ratio of a photosensitive organic film manufactured by curing the photosensitive resin composition according to an embodiment.

The first solvent having the polarity index of 0.1 times or less relative to a polarity index of water may include alkanes (R—H) such as pentane, hexane, heptanes, and the like; aromatic hydrocarbons (Ar—H) such as toluene, xylene, and the like; ethers (R—O—R) such as diisoamyl ether, dibutyl ether, and the like; alkyl halides (R—X) such as chloroform, trichloro methane, and the like; cycloalkanes such as cyclopropane, cyclobutane, cyclopentane, cyclohexane, and the like; and the like but is not limited thereto.

The photosensitive resin composition according to an embodiment may further include a second solvent having a polarity index of 0.2 times to 0.6 times relative to a polarity index of water. The photo-conversion material such as the quantum dot has compatibility with the first solvent, while the above binder resin, the photopolymerizable monomer, the photopolymerization initiator, and the like may have compatibility with the second solvent. However, since the binder resin, the photopolymerizable monomer, the photopolymerization initiator, and the like have compatibility with the first solvent to a degree, but the photo-conversion material has almost no compatibility with the second solvent, the photosensitive resin composition according to an embodiment may form a photosensitive resin film having a more excellent photo-conversion rate when only the first solvent is used than when the first and second solvents are used as a mixed solvent.

On the other hand, when the first and second solvents are used as a mixture, the first solvent may be included in an amount of 0.3 times or greater relative to the amount of the second solvent. For example, the first solvent may be included in an amount of 1 time or greater, for example, 4 times or greater relative to the amount of the second solvent. When the first and second solvents are included in the above range, the mixed solvent may have an equivalent photo-conversion rate compared with when only the first solvent is used and improve coating property and processibility.

The second solvent having the polarity index of 0.2 times to 0.6 times relative to a polarity index of water may be, alcohols such as methanol, ethanol, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate ester compounds such as ethyl pyruvate and the like, and a solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used, but is not limited thereto.

For example, considering compatibility and reactivity, the second solvent may be glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like may be preferably used.

The solvent is used in a balance amount, for example 50 wt % to 90 wt %, for example 60 wt % to 80 wt % based on the total amount of the photosensitive resin composition. When the solvent is within the range, the photosensitive resin composition has appropriate viscosity and thus may have excellent coating property when coated in a large area through spin-coating and slit-coating.

On the other hand, a polarity index (Snyder Polarity Index) of several compounds used as the solvent and their solubility about water are shown in Table 1.

TABLE 1

| Solvent | Polarity index | Solubility (%) |
| --- | --- | --- |
| Heptane | 0 | 0.0003 |
| Hexane | 0 | 0.001 |
| Pentane | 0 | 0.004 |
| Cyclohexane | 0.2 | 0.01 |
| Trichloroethylene | 1 | 0.11 |
| Carbon Tetrachloride | 1.6 | 0.08 |
| Di-Iso-Propyl Ether | 2.2 | 0 |
| Toluene | 2.4 | 0.051 |
| propylene glycol monomethylether acetate (PGMEA) | 2.0 to 5.0 | 19.8 |
| Methyl-t-Butyl Ether | 2.5 | 4.8 |
| Xylene | 2.5 | 0.018 |
| Benzene | 2.7 | 0.18 |
| Diethyl Ether | 2.8 | 6.89 |
| Dichloromethane | 3.1 | 1.6 |
| 1,2-Dichloroethane | 3.5 | 0.81 |
| Butyl Acetate | 3.9 | 7.81 |
| Iso-Propanol | 3.9 | 100 |
| n-Butanol | 4 | 0.43 |
| Tetrahydrofuran | 4 | 100 |
| n-Propanol | 4 | 100 |
| Chloroform | 4.1 | 0.815 |
| Ethyl Acetate | 4.4 | 8.7 |
| 2-Butanone | 4.7 | 24 |
| Dioxane | 4.8 | 100 |
| Acetone | 5.1 | 100 |
| Methanol | 5.1 | 100 |

TABLE 1-continued

| Solvent | Polarity index | Solubility (%) |
| --- | --- | --- |
| Ethanol | 5.2 | 100 |
| Acetonitrile | 5.8 | 100 |
| Acetic Acid | 6.2 | 100 |
| Dimethylformamide | 6.4 | 100 |
| Dimethyl Sulfoxide | 7.2 | 100 |
| Water | 9 | 100 |

(F) Thiol-Based Additive

In order to improve stability and dispersibility of the quantum dot, a photosensitive resin composition according to an embodiment may further include a thiol-based additive.

The thiol-based additive is substituted in the shell surface of the quantum dot and thus may improve dispersion stability of the quantum dot about a solvent and stabilize the quantum dot.

The thiol-based additive may have 2 to 10, for example, 2 to 4 thiol groups (—SH) depending on a structure.

For example, the thiol-based additive may include at least two functional groups represented by Chemical Formula 1.

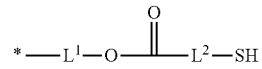

[Chemical Formula 1]

In Chemical Formula 1, $L^1$ and $L^2$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

For example, the thiol-based additive may be represented by Chemical Formula 2.

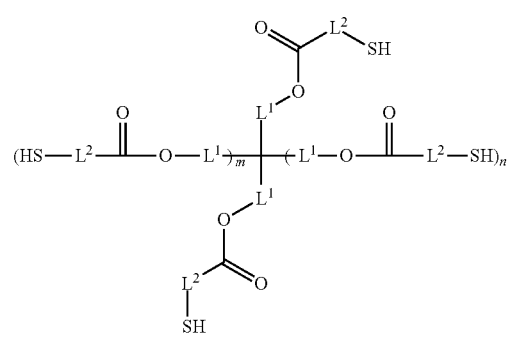

[Chemical Formula 2]

In Chemical Formula 2, $L^1$ and $L^2$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group, and m and n are independently an integer ranging from 0 or 1.

For example, in Chemical Formula 1 and Chemical Formula 2, the $L^1$ and $L^2$ may independently be a single bond or a substituted or unsubstituted C1 to C20 alkylene group.

Specific examples of the thiol-based additive may be selected from pentaerythritol tetrakis(3-mercaptopropionate) represented by Chemical Formula 2a, trimethylolpropane tris(3-mercaptopropionate) represented by Chemical Formula 2b, pentaerythritol tetrakis(mercaptoacetate) represented by Chemical Formula 2c, trimethylolpropane tris(2-mercaptoacetate) represented by Chemical Formula 2d, glycol di-3-mercaptopropionate represented by Chemical Formula 2e, and a combination thereof.

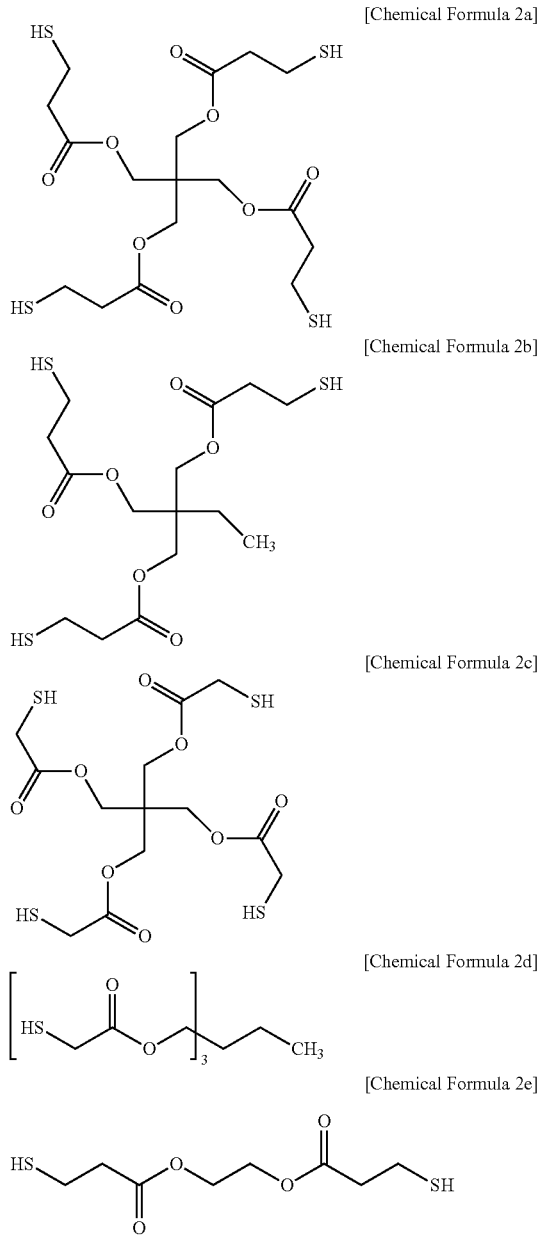

[Chemical Formula 2a]

[Chemical Formula 2b]

[Chemical Formula 2c]

[Chemical Formula 2d]

[Chemical Formula 2e]

The thiol-based additive may be included in an amount of 0.1 wt % to 5 wt %, for example 0.5 wt % to 2 wt % based on the total amount of photosensitive resin composition. When the thiol-based additive is included within the range, stability of the photo-conversion material such as a quantum dot may be improved, and a thiol group in the thiol-based additive reacts with an acryl group of the post-described binder resin or photopolymerizable monomer and forms a covalent bond and thus may improve heat resistance of the photo-conversion material such as a quantum dot.

(G) Scatter

A photosensitive resin composition according to an embodiment includes a scatter.

For example, the scatter may include barium sulfate ($BaSO_4$), calcium carbonate ($CaCO_3$), titanium dioxide ($TiO_2$), zirconia ($ZrO_2$), or a combination thereof.

The scatter may reflect light not absorbed in the photo-conversion material and help the photo-conversion material re-absorb the reflected light. In other words, the scatter may increase the amount of light absorbed in the photo-conversion material and thus photo conversion efficiency of the photosensitive resin composition.

The scatter may have an average particle diameter (D50) of 150 nm to 250 nm, for example, 180 nm to 230 nm. When the scatter has an average particle diameter within the range, more excellent light diffusion effects may be obtained, and photoconversion efficiency may be increased.

The scatter may be included in an amount of 0.1 wt % to 5 wt %, for example 1 wt % to 3 wt % based on the total amount of the photosensitive resin composition. When the scatter is included in an amount of less than 0.1 wt % based on the total amount of the photosensitive resin composition, an effect of improving photoconversion efficiency by the scatter may not be obtained, but when the scatter is included in an amount of greater than 0.1 wt %, pattern characteristics of a photosensitive organic film may be deteriorated.

(H) Other Additive

A photosensitive resin composition according to an embodiment may include malonic acid; 3-amino-1,2-propanediol; a silane-based coupling agent; a leveling agent; fluorine-based surfactant; or a combination thereof in order to improve heat resistance and reliability.

For example, photosensitive resin composition may further include a silane-based coupling agent having a reactive substituent such as a vinyl group, a carboxyl group, a methacryloxy group, an isocyanate group, an epoxy group and the like in order to improve close contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like. These may be used alone or in a mixture of two or more.

The silane-based coupling agent may be used in an amount of 0.01 parts by weight to 10 parts by weight based on 100 parts by weight of the photosensitive resin composition. When the silane-based coupling agent is included within the range, close contacting properties, storage capability, and the like are improved.

The photosensitive resin composition may further include a surfactant, for example a fluorine-based surfactant as needed in order to improve coating properties and inhibit generation of spots, that is, improve leveling performance.

The fluorine-based surfactant may have a low weight average molecular weight of 4,000 g/mol to 10,000 g/mol, specifically 6,000 g/mol to 10,000 g/mol. In addition, the fluorine-based surfactant may have a surface tension of 18 mN/m to 23 mN/m (measured in a 0.1% polyethylene glycol monomethylether acetate (PGMEA) solution). When the fluorine-based surfactant has a weight average molecular weight and a surface tension within the range, leveling performance may be further improved, and excellent characteristics may be provided when slit coating as high speed coating is applied since film defects may be less generated by preventing a spot generation during the high speed coating and suppressing a vapor generation.

Examples of the fluorine-based surfactant may be, BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like of DIC Co., Ltd.

The surfactant may further include a silicone-based surfactant in addition to the fluorine-based surfactant. Specific examples of the silicone-based surfactant may be TSF400, TSF401, TSF410, TSF4440, and the like of Toshiba silicone Co., Ltd., but is not limited thereto.

The surfactant may be included in an amount of 0.01 parts by weight to 5 parts by weight, for example 0.1 parts by weight to 2 parts by weight based on 100 parts by weight of the photosensitive resin composition. When the surfactant is included within the range, a foreign material is less produced after the development.

In addition, the photosensitive resin composition according to an embodiment may further include other additives such as an antioxidant, a stabilizer, and the like in a predetermined amount, unless properties are deteriorated.

According to another embodiment, a color filter manufactured using the photosensitive resin composition is provided. The color filter may be manufactured as follows.

(1) Application and Film Formation

The photosensitive resin composition is coated to have a desired thickness, for example, a thickness ranging from 2 μm to 10 μm, on a substrate which undergoes a predetermined pretreatment, using a spin or slit coating method, a roll coating method, a screen-printing method, an applicator method, and the like. Then, the coated substrate is heated at a temperature ranging from about 70° C. to about 90° C. for about 1 minute to about 10 minutes to remove a solvent.

(2) Exposure

The resultant film is radiated by an active ray such as UV ray of 190 nm to 450 nm, for example 200 nm to 500 nm after putting a mask with a predetermined shape to form a desired pattern. The radiation is performed by using a light source such as a mercury lamp with a low pressure, a high pressure, or an ultrahigh pressure, a metal halide lamp, an argon gas laser, and the like. An X ray, an electron beam, and the like may be also used as needed.

Exposure process uses, for example, a light dose of about 500 mJ/cm$^2$ or less (with a 365 nm sensor) when a high pressure mercury lamp is used. However, the light dose may vary depending on kinds of each component of the black photosensitive resin composition, its combination ratio, and a dry film thickness.

(3) Development

After the exposure process, an alkali aqueous solution is used to develop the exposed film by dissolving and removing an unnecessary part except the exposed part, forming an image pattern. In other words, when the alkali developing solution is used for the development, a non-exposed region is dissolved, and an image color filter pattern is formed.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Hereinafter, the present invention is illustrated in more detail with reference to examples. These examples, however, are not in any sense to be interpreted as limiting the scope of the invention.

(Preparation of Photosensitive Resin Composition)

Examples 1 to 10 and Comparative Examples 1 to 8

Each photosensitive resin composition according to Examples 1 to 10 and Comparative Examples 1 to 8 was prepared to respectively have a composition in Tables 2 and 3 by using the following components.

Specifically, a photopolymerization initiator was dissolved in a solvent and then, a solution therefrom was sufficiently stirred for 2 hour at room temperature. Subsequently, a photopolymerizable monomer and an acryl-based binder resin along with a photo-conversion material (a quantum dot) and a dispersing agent (TEGO D685, EVONIK Industries) were added thereto, and the mixture was stirred again for 2 hours at room temperature. Then, a thiol-based additive, a dispersing agent, and a fluorine-based surfactant were added thereto, the obtained mixture was stirred at room temperature for one hour, and a product therefrom was three times filtered to remove impurities to prepare each photosensitive resin composition.

(When a green quantum dot was used as the photo-conversion material, the dispersing agent was added in an amount of 15 wt % based on the amount of the green quantum dot solid, and when a red quantum dot was used as the photo-conversion material, the dispersing agent was added in an amount of 20 wt % based on the amount of the red quantum dot solid).

(A) Photo-Conversion Material (A-1) Green QD

InP/ZnS quantum dot (fluorescence $\lambda_{em}$=525 nm, FWHM=40 nm, Green QD, Hansonl Chemical)

(A-2) Red QD

InP/ZnS quantum dot (fluorescence $\lambda_{em}$=630 nm, FWHM=45 nm, Red QD, Hansol Chemical)

CB) Binder Resin

Acryl-based binder resin (SP-RY16, Showa Denko K.K.)

(C) Photopolymerizable Monomer

Dipentaerythritolhexaacrylate (DPHA, Nippon Kayaku Co. Ltd.)

(D) Photopolymerization Initiator

Oxime-based initiator (OXE02, BASF SE)

(E) Solvent (E-1) Heptane (Sigma-Aldrich Corporation)

(E-2) Cyclohexane (Sigma-Aldrich Corporation)

(E-3) Propylene glycol monomethylether acetate (PGMEA, Sigma-Aldrich Corporation)

(E-4) Dimethylsulfoxide (DMSO, Sigma-Aldrich Corporation)

(E-5) Water (F) Thiol-based Additive

Glycol di-3-mercaptopropionate (BRUNO BOCK Chemische Fabrik GmbH & Co. KG)

(G) Dispersing Agent

Titanium dioxide dispersion liquid (TiO$_2$ solid: 20 wt %, Average particle diameter: 200 nm, Ditto Technology)

(G) Other Additives

Fluorine-based Surfactant (DIC Co., Ltd., F-554)

TABLE 2

(unit: wt %)

| | | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| (A) photo-conversion material | A-1 | — | — | — | — | — | — | — | — | — |
| | A-2 | 12 | 12 | 12 | 12 | 12 | 12 | 12 | 12 | 12 |
| (B) binder resin | | 8 | 8 | 8 | 8 | 8 | 8 | 8 | 8 | 8 |
| (C) photopolymerizable monomer | | 4 | 4 | 4 | 4 | 4 | 4 | 4 | 4 | 4 |
| (D) photopolymerization initiator | | 0.7 | 0.7 | 0.7 | 0.7 | 0.7 | 0.7 | 0.7 | 0.7 | 0.7 |
| (E) solvent | E-1 | 70 | — | — | — | — | — | — | — | — |
| | E-2 | — | 70 | 66.5 | 56 | 35 | 14 | — | — | — |
| | E-3 | — | — | 3.5 | 14 | 35 | 56 | 70 | — | — |
| | E-4 | — | — | — | — | — | — | — | 70 | — |
| | E-5 | — | — | — | — | — | — | — | — | 70 |
| (F) thiol-based additive | | 1.1 | 1.1 | 1.1 | 1.1 | 1.1 | 1.1 | 1.1 | 1.1 | 1.1 |
| (G) scatter | | 4.0 | 4.0 | 4.0 | 4.0 | 4.0 | 4.0 | 4.0 | 4.0 | 4.0 |
| (H) other additive | | 0.2 | 0.2 | 0.2 | 0.2 | 0.2 | 0.2 | 0.2 | 0.2 | 0.2 |
| Total | | 100.0 | 100.0 | 100.0 | 100.0 | 100.0 | 100.0 | 100.0 | 100.0 | 100.0 |

TABLE 3

(unit: wt %)

| | | Example 6 | Example 7 | Example 8 | Example 9 | Example 10 | Comparative Example 5 | Comparative Example 6 | Comparative Example 7 | Comparative Example 8 |
|---|---|---|---|---|---|---|---|---|---|---|
| (A) Photo-conversion material | A-1 | 18 | 18 | 18 | 18 | 18 | 18 | 18 | 18 | 18 |
| | A-2 | — | — | — | — | — | — | — | — | — |
| (B) Binder resin | | 3 | 3 | 3 | 3 | 3 | 3 | 3 | 3 | 3 |
| (C) Photopolymerizable monomer | | 2 | 2 | 2 | 2 | 2 | 2 | 2 | 2 | 2 |
| (D) Photopolymerization initiator | | 0.2 | 0.2 | 0.2 | 0.2 | 0.2 | 0.2 | 0.2 | 0.2 | 0.2 |
| (E) Solvent | E-1 | 70 | — | — | — | — | — | — | — | — |
| | E-2 | — | 70 | 66.5 | 56 | 35 | 14 | — | — | — |
| | E-3 | — | — | 3.5 | 14 | 35 | 56 | 70 | — | — |
| | E-4 | — | — | — | — | — | — | — | 70 | — |
| | E-5 | — | — | — | — | — | — | — | — | 70 |
| (F) Thiol-based additive | | 1.6 | 1.6 | 1.6 | 1.6 | 1.6 | 1.6 | 1.6 | 1.6 | 1.6 |
| (G) Scatter | | 5 | 5 | 5 | 5 | 5 | 5 | 5 | 5 | 5 |
| (H) Other additive | | 0.2 | 0.2 | 0.2 | 0.2 | 0.2 | 0.2 | 0.2 | 0.2 | 0.2 |
| Total | | 100.0 | 100.0 | 100.0 | 100.0 | 100.0 | 100.0 | 100.0 | 100.0 | 100.0 |

Evaluation 1: Dispersion Stability of Quantum Dot

The blue light absorption rate of each photosensitive resin composition according to Examples 5 and 10 was measured, and the results are provided in FIG. 1.

As shown in FIG. 1, the photosensitive resin composition of Example 5 showed a blue light absorption rate of 72%, the photosensitive resin composition of Example 10 showed a blue light absorption rate of 75%, and thus dispersion stability of quantum dots in the photosensitive resin composition according to an embodiment was sufficiently secured.

Evaluation 2: PLOY (Photoluminescence Quantum Yield)

15 ml of each photosensitive resin composition of Examples 1 to 10 and Comparative Examples 1 to 8 was taken, coated to be 3.5 μm thick on a glass substrate with a spin coater (Opticoat MS-A150, Mikasa Co., Ltd.), soft-baked at 90° C. for 3 minutes by using a hot-plate, exposed to UV by using an exposer (Ghi Broadband, Ushio Inc.) with power of 50 mJ/cm$^2$ to form a primary film. Subsequently, the primary film was developed by using a developer (SSP-200, SVS) with a 0.2 wt % potassium hydroxide (KOH) aqueous solution. Subsequently, the film was hard-baked at 150° C. or 230° C. in a convection oven for 30 minutes to obtain a patterned photosensitive organic film.

PLQY of each color filter manufactured by respectively the photosensitive resin compositions according to Examples 1 to 10 and Comparative Examples 1 to 8 was measured by using a Quantaurus-QY Quantum yield spectrometer (C11347-11, Hamamatsu Corp., Japan), and herein, the measurement was performed after adjusting a sample (the photosensitive resin compositions according to Examples 1 to 10 and Comparative Examples 1 to 8) to have an absorption rate of 0.4. In general, the PLQY was obtained by using Equation 1. The PLQY results are provided in Tables 4 and 5.

PLQY=the number of photons emitted as photoluminescence from sample/the number of photons absorbed by sample [Equation 1]

Figure 2:
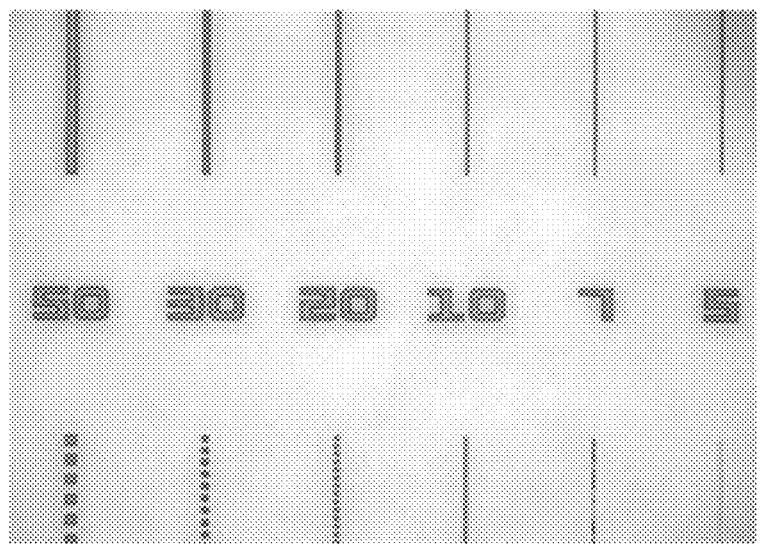
FIGS. 2 and 3 are pattern photographs of a color filter independently manufactured by using the photosensitive resin composition of Example 9.
Figure 4:
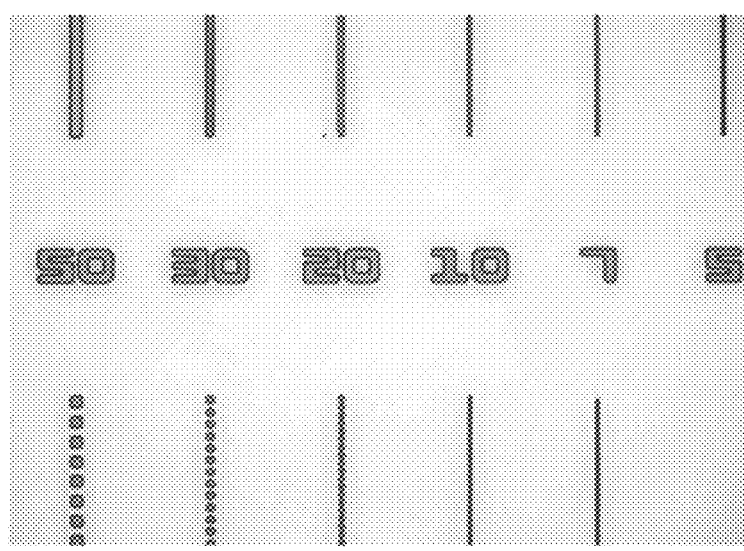
FIGS. 4 and 5 are pattern photographs of a color filter independently manufactured by using the photosensitive resin composition of Example 4.
Figure 6:
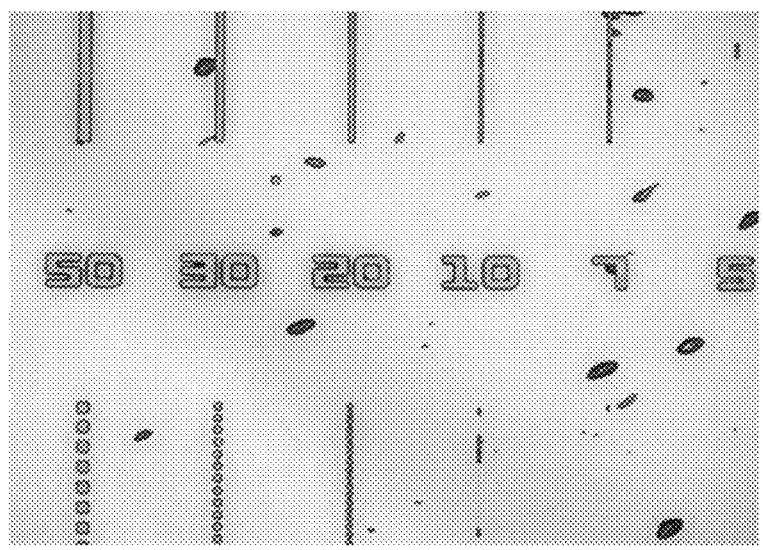
FIGS. 6 and 7 are pattern photographs of a color filter independently manufactured by using the photosensitive resin composition of Comparative Example 1.
Figure 8:
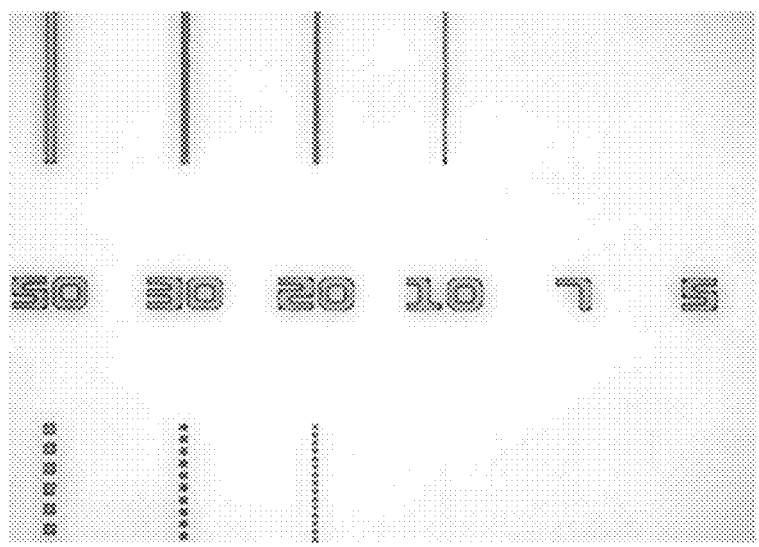
FIG. 8 and FIG. 9 are pattern photographs of a color filter independently manufactured by using the photosensitive resin composition of Comparative Example 5.

Evaluation Reference for Quantum Dot in Dispersion State
○: Quantum dots are well dispersed
Δ: A few of quantum dots is agglomerated
X: Quantum dots are not dispersed but all agglomerated potassium hydroxide (KOH) aqueous solution (100 times diluted) by using a developer (SSP-200, SVS), and hard-baked at 180° C. for 30 minutes, and then, each resolution was examined with an optical microscope to evaluate pattern characteristics with naked eyes (excellent/unsatisfactory). The pattern characteristic evaluation results are provided in FIGS. 2, 4, 6, and 8. (FIG. 2 shows the result of Example 9, FIG. 4 shows the result of Example 4, FIG. 6 shows the result of Comparative Example 1, and FIG. 8 shows the result of Comparative Example 5.)

On the other hand, the adherence was evaluated by judging whether a 10 μm pattern was realized or not (○/X), and the adherence evaluation results are provided in FIGS.

TABLE 4

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| PLQY (%) | 86 | 85 | 85 | 84 | 78 | 45 | immeasurable | immeasurable | immeasurable |
| Quantum dot dispersion state | ○ | ○ | ○ | ○ | Δ | Δ | X | X | X |

TABLE 5

|  | Example 6 | Example 7 | Example 8 | Example 9 | Example 10 | Comparative Example 5 | Comparative Example 6 | Comparative Example 7 | Comparative Example 8 |
|---|---|---|---|---|---|---|---|---|---|
| PLQY (%) | 90 | 92 | 90 | 87 | 85 | 42 | immeasurable | immeasurable | immeasurable |
| Quantum dot dispersion state | ○ | ○ | ○ | ○ | ○ | Δ | X | X | X |

As shown in Tables 4 and 5, Examples 1 and 2 using a solvent having less than or equal to 0.1 times as high a polarity index as the polarity index of water (a first solvent) and Examples 3 to 5 using a mixture of the solvent with a solvent having 0.2 times to 0.6 times as high a polarity index as the polarity index of water (a second solvent) showed high compatibility with a quantum dot having a hydrophobic surface and thus turned out to well disperse the quantum dot in the solvent (without agglomeration of the quantum dot) and show an excellent photo-conversion rate. On the contrary, Comparative Examples 1 to 4 used the first solvent less than 0.3 times more than the second solvent and a solvent having a higher polarity index than the first and second solvents and thus had low compatibility with a quantum dot having a hydrophobic surface and did not well disperse the quantum dot in the solvent with agglomeration. Furthermore, when the first solvent was not included as a solvent, the quantum dot was not dispersed in the solvent at all, and thus a photo-conversion rate itself was immeasurable. Conventionally, when a photo-conversion material such as a quantum dot and the like has excellent dispersion stability, an appropriate distance among particles may be secured, and thus as shown in Tables 4 and 5, an excellent photo-conversion rate may be also excellently secured.

Evaluation 3: Pattern Characteristics and Adherence 15 ml of each photosensitive resin composition according to Examples 4 and 9 and Comparative Examples 1 and 5 was taken, spin-coated to be 5 μm thick on a glass substrate by using a spin-coater (Opticoat MS-A150, Mikasa Co., Ltd.), soft-baked at 100° C. for 1 minute by using a hot-plate, and exposed to UV by using an exposer (Ghi Broadband, Ushio Inc.) with power of 60 mJ/cm² to form a primary film. Subsequently, the film was developed and patterned in a

Figure 3:
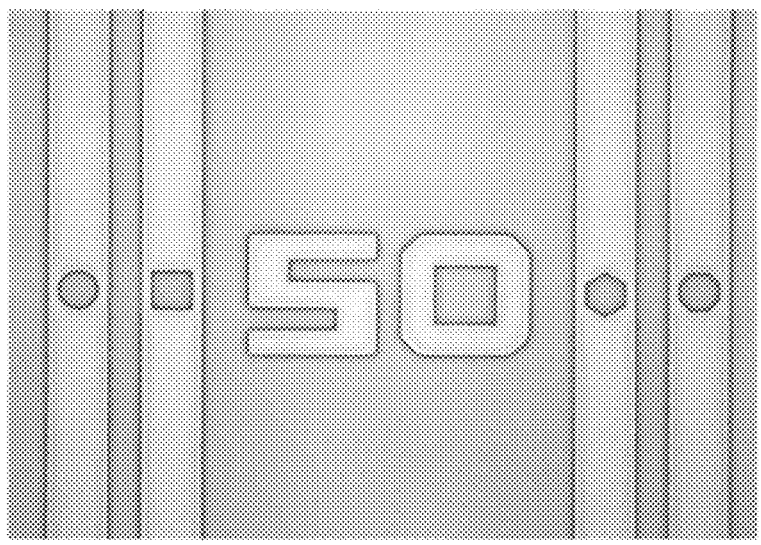
Figure 5:
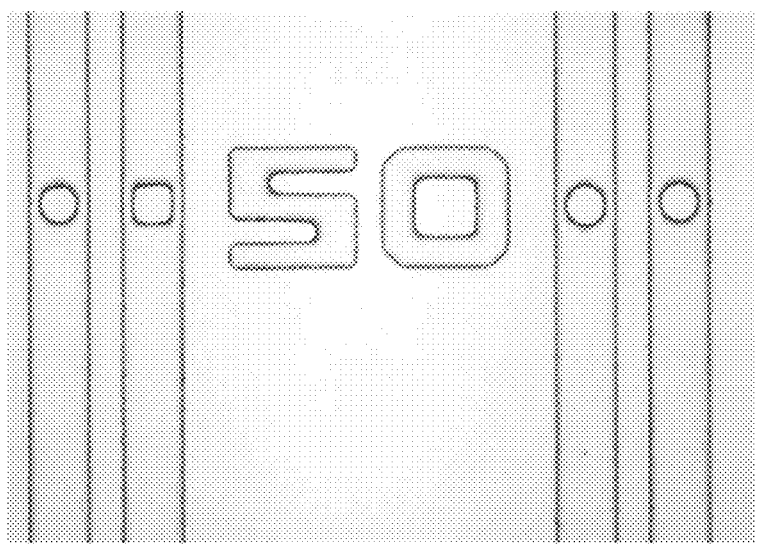
Figure 7:
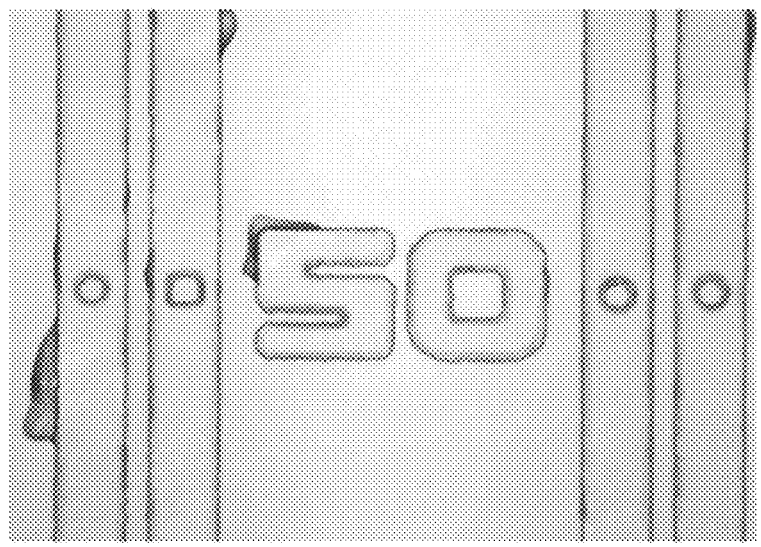

3, 5, 7, and 9. (FIG. 3 shows the result of Example 9, FIG. 5 shows the result of Example 4, FIG. 7 shows the result of Comparative Example 1, and FIG. 9 shows the result of Comparative Example 5.)

Figure 9:
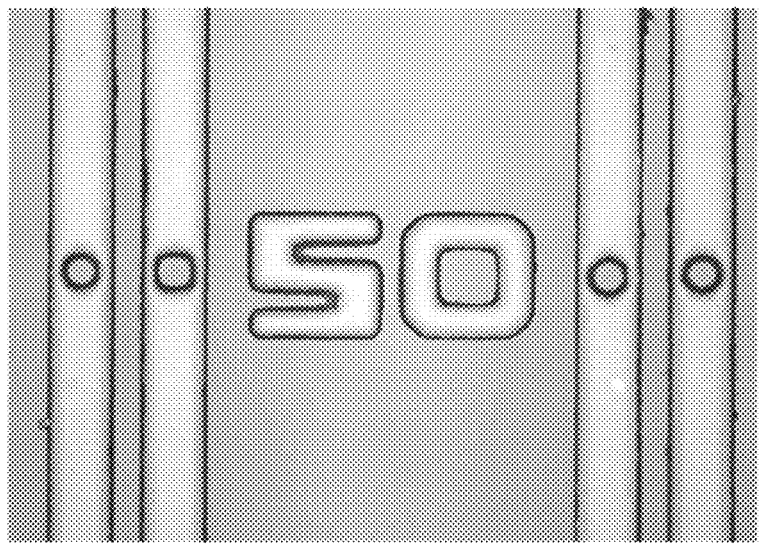

FIG. 2 to as shown in FIG. 9, Examples 4 and 9 had excellent pattern characteristics and adherence, but when Comparative Examples 1 and 5 including a solvent having affinity to a quantum dot in less than or equal to a predetermined amount, a partial precipitation occurred, development characteristics and pattern characteristics were deteriorated, and thus quantum dots therein were agglomerated after the development, and adherence of a pattern was over all deteriorated.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising
(A) a photo-conversion material;
(B) a binder resin;
(C) a photopolymerizable monomer;
(D) a photopolymerization initiator; and
(E) a solvent,
wherein the solvent includes:
a first solvent having a Snyder Polarity Index of 0.1 times or less relative to a Snyder Polarity Index of water, and a second solvent having a Snyder Polarity Index of 0.2 times to 0.6 times relative to a Snyder Polarity Index of water, wherein the first solvent is included in an amount of at least four times the amount of the second solvent.

2. The photosensitive resin composition of claim 1, wherein the photosensitive resin composition further includes (G) a scatter.

3. The photosensitive resin composition of claim 2, wherein the scatter includes barium sulfate, calcium carbonate, titanium dioxide, zirconia, or a combination thereof.

4. The photosensitive resin composition of claim 2, wherein the scatter is included in an amount of 0.1 wt % to 5 wt % based on the total amount of the photosensitive resin composition.

5. The photosensitive resin composition of claim 1, wherein the photo-conversion material is a quantum dot that absorbs light in a wavelength region of 360 nm to 780 nm and emits fluorescence in a wavelength region of 500 nm to 700 nm.

6. The photosensitive resin composition of claim 1, wherein the photosensitive resin composition includes 1 wt % to 50 wt % of the (A) photo-conversion material;
10 wt % to 50 wt % of the (B) binder resin;
1 wt % to 30 wt % of the (C) photopolymerizable monomer;
0.1 wt % to 5 wt % of the (D) photopolymerization initiator; and
a balance amount of the (E) solvent based on the total amount of the photosensitive resin composition.

7. The photosensitive resin composition of claim 1, wherein the photosensitive resin composition further includes malonic acid, 3-amino-1,2-propanediol, a silane-based coupling agent, a leveling agent, a fluorine-based surfactant, or a combination thereof.

8. A color filter, the color filter being manufactured by:
coating the photosensitize resin composition of claim 1 on a substrate and drying the composition to form a film;
exposing the film by irradiating the film with an active ray; and
developing the film to form the color filter.

9. The photosensitive resin composition of claim 1, wherein the photosensitive resin composition further includes (F) a thiol-based additive.

10. The photosensitive resin composition of claim 9, wherein the thiol-based additive includes at least two functional groups represented by Chemical Formula 1:

[Chemical Formula 1]

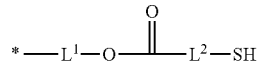

wherein, in Chemical Formula 1, $L^1$ and $L^2$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

11. The photosensitive resin composition of claim 9, wherein the thiol-based additive is included in an amount of 1 wt % to 10 wt % based on the total amount of the photosensitive resin composition.

* * * * *